United States Patent
Brede et al.

[11] Patent Number: 5,905,687
[45] Date of Patent: May 18, 1999

[54] FUSE REFRESH CIRCUIT

[75] Inventors: Rüdiger Brede, Hoehenkirchen; Dominique Savignac, Ismaning; Norbert Wirth, Unterschleissheim, all of Germany

[73] Assignee: Siemens Aktiengesellschaft, Munich, Germany

[21] Appl. No.: 08/904,500

[22] Filed: Aug. 1, 1997

[30] Foreign Application Priority Data

Aug. 1, 1996 [DE] Germany .............................. 196 31 130

[51] Int. Cl.$^6$ ........................................................ G11C 7/00
[52] U.S. Cl. ....................... 365/222; 365/225.7; 365/200; 365/96; 327/525
[58] Field of Search ................................. 365/222, 225.7, 365/96, 200; 327/525

[56] References Cited

U.S. PATENT DOCUMENTS

| | | |
|---|---|---|
| 4,532,607 | 7/1985 | Uchida ........................................ 365/96 |
| 4,837,520 | 6/1989 | Golke et al. .............................. 365/200 |
| 5,319,592 | 6/1994 | Nguyen ....................................... 365/96 |
| 5,566,107 | 10/1996 | Gilliam .................................... 365/200 |
| 5,619,469 | 4/1997 | Joo ........................................ 365/225.7 |
| 5,680,360 | 10/1997 | Pilling et al. ........................ 365/225.7 |

Primary Examiner—David Nelms
Assistant Examiner—Tuan T. Nguyen
Attorney, Agent, or Firm—Herbert L. Lerner; Laurence A. Greenberg

[57] ABSTRACT

The fuse refresh circuit for semiconductor memories has a set circuit for setting a fuse latch circuit. The fuse latch circuit is set by the set circuit in at least one refresh cycle after a voltage supply has been switched on. During the refresh cycle of the fuse latch circuit, the latter is driven with pulses in such a way that the state of the fuse latch circuit is evaluated and only an incorrectly set fuse latch circuit is set to be correct.

11 Claims, 6 Drawing Sheets

FUSE REFRESH CIRCUIT

BACKGROUND OF THE INVENTION

1. Field of the Invention

The invention pertains to fuse refresh circuits for semiconductor memories, wherein a fuse latch circuit is set by a set circuit in at least one refresh cycle after a voltage supply has been switched on.

Fuse refresh circuits are conventionally employed in order to ensure redundancy especially in semiconductor memory configurations. Specifically, according to the redundancy principle, in a semiconductor memory configuration it is necessary to replace any defective memory cells by memory cells which are operating without any defects. The fuse refresh circuit in this case constitutes a device which, depending on the logic signals fed to it, supplies at its output a defined logic state which may be a "0" or "1", which in turn depends on whether or not the fuse is severed. The fuse is thus a safety device in its true sense insofar as an electrical line is switched on, i.e., set, or severed. "Refresh" should be understood to mean that when the semiconductor memory configuration is switched on, the individual fuses are checked by means of fuse latch circuits, in other words the memory is "refreshed".

2. Description of the Related Art

A conventional prior art fuse refresh circuit is illustrated in FIG. 2. After a DRAM (e.g. 16 Mbit) has been switched on, a set circuit (not shown in FIG. 2) supplies a voltage for a signal CLRN which has a value of 0 V at an operating voltage of about 1 V. If the operating voltage then subsequently reaches a value of about 2.7 V, then the signal CLRN likewise assumes a value of 2.7 V which then follows the operating voltage in the further course of events. The signal CLRN is fed to a p-MOS transistor or FET 14 of the fuse refresh circuit. This p-MOS transistor 14, which has a negative threshold voltage, is connected in series with an n-MOS transistor 16, which has a positive threshold voltage, and with a fuse 20. A fuse latch circuit comprising transistors 17, 19 of mutually opposite conductivity type and an inverter 50 is connected downstream of this series circuit.

The signal CLRN, before it has reached the operating voltage $V_B$ (compare FIG. 3), sets the fuse latch circuit via the p-MOS transistor 14 in such a way that a "1" is present at the input D1 of the fuse latch circuit, i.e., D1="1".

After the signal CLRN has reached the operating voltage, the set circuit supplies a voltage pulse with a duration of about 20 ns for a signal SETP which is fed to the gate of the MOS transistor 16. If the fuse 20 is actually severed, then the input D1 remains set at "1". If, however, the fuse 20 is not severed, then the fuse latch circuit is set in such a way that D1="0". Depending on the state of D1, an address signal AO and a brain signal BRAIN a "0" or a "1" is then present at the output 30 of the fuse refresh circuit.

A two-stage inverter circuit comprising inverters 51, 52 and a parallel circuit comprising MOS transistors 25, 26, 27 and 28 are provided between the inverter 50 and the output 30, the MOS transistors 25 and 26 having the same conductivity type as the MOS transistors 14 and 17, respectively, and the MOS transistors 27, 28 having the same conductivity type as the MOS transistors 16 and 19, respectively. The gate of the MOS transistor 25 is in this case connected to the source and/or drain of the MOS transistor 26, the gate of which is connected to the gate of the MOS transistor 27. The source and/or drain of the transistor 27 is in turn connected to the gate of the MOS transistor 28. The source and/or drain of the MOS transistor 28 is connected to the sources and/or drains of MOS transistors 10, 11, which are of the same conductivity type as the MOS transistor 14. The address signal AO is fed to the gate of the MOS transistor 10 and to the gate of a MOS transistor 9 connected in series with the latter. The signal BRAIN is applied to the gate of the transistor 11 and to the gate of a MOS transistor 8.

For reasons which are difficult to explain in individual cases, problems arise in the existing fuse refresh circuit of FIG. 2 with regard to incorrectly set fuse latch circuits. In other words, in the event of an incorrectly set fuse latch circuit, the signal D1 has, for example, the value "1" even though it should have the value "0". As a consequence, the opposite state to the "correct state" is then likewise present at the output 30.

A partial voltage dip to about 1 V during switching-on with very steep voltage slopes or an incompletely severed fuse having a residual resistance of 100 kΩ for example, may be assumed to be possible causes of such incorrectly set fuse latch circuits.

Since the 16 Mbit DRAM has about 2,000 fuses, the occurrence of an incorrectly set fuse latch circuit entails extensive investigations, which, nevertheless, do not always yield absolute clarity concerning the defect mechanism that has occurred. These investigations may be so extensive that it is often more expedient to reject the semiconductor memory configuration and not to search for a remedy for the incorrectly set fuse refresh circuit. It is quite understood, however, that such a course of action is undesirable in every way.

SUMMARY OF THE INVENTION

It is accordingly an object of the invention to provide a fuse refresh circuit, which overcomes the above-mentioned disadvantages of the heretofore-known devices and methods of this general type and which is constructed in such a way that an incorrect set state can readily be reported.

With the foregoing and other objects in view there is provided, in accordance with the invention, a fuse refresh circuit for a semiconductor memory, comprising:

a fuse latch circuit;

a set circuit connected to the fuse latch circuit for setting the fuse latch circuit in at least one refresh cycle after a voltage supply has been switched on;

during the refresh cycle, the set circuit driving the fuse latch circuit with pulses such that a set state of the fuse latch circuit is evaluated and only an incorrectly set fuse latch circuit is reset.

In accordance with an added feature of the invention, the fuse latch circuit includes a first MOS transistor, a second MOS transistor, a third MOS transistor, and an inverter, the first, second and third MOS transistors each having a gate and being mutually connected in series, the first MOS transistor being of a first conductivity type and the second and third MOS transistors being of a second conductivity type opposite to the first conductivity type, the inverter having an input connected to a node between the first and second MOS transistors and having an output connected to the gates of the first and second MOS transistors, and end of the third MOS transistor remote from the second MOS transistor being connected to a reference potential, preferably ground, and the gate of the third MOS transistor being driven by a first one of the pulses for driving the fuse latch circuit.

In accordance with an additional feature of the invention, the input of the inverter is connected to a series circuit comprising a fourth MOS transistor of the first conductivity type, a fifth MOS transistor of the second conductivity type and a fuse.

In accordance with a further feature of the invention, the pulses for driving the fuse latch circuit include the first pulse, a second pulse connected to a gate of the fourth MOS transistor, and a third pulse connected to a gate of the fifth MOS transistor. The first pulse is preferably generated by inverting and delaying the third pulse.

In accordance with again an added feature of the invention, the input of the inverter is connected to a node formed between the fourth MOS transistor and the fifth MOS transistor.

In accordance with again an additional feature of the invention, a potential level of the second pulse is lower than a potential level of the third pulse.

In accordance with again a further feature of the invention, the set circuit includes a series circuit comprising a plurality of inverters and a NOR gate, the series circuit generating the third pulse from a fuse refresh trigger pulse and a set pulse during an RAS cycle.

In accordance with a concomitant feature of the invention, the set circuit includes a further plurality of inverters generating the second pulse from a fuse refresh trigger pulse and a clear pulse during the RAS cycle.

The essential feature of the invention is that only an incorrectly set state is reported and the circuit is not reset in every case. In other words, in a semiconductor memory configuration only the incorrectly set fuse latch circuits are reset, while the correctly set fuse latch circuit does not need to be reset during the refresh cycle. Obviously, it is also possible to save current by this means.

In the fuse refresh circuit according to the invention, specially configured pulses are fed to the fuse refresh circuit. Those special pulses are ultimately obtained by delaying and inverting the pulses CLRN and SETP, as will be explained in more detail below. Moreover the series circuit formed by the two MOS transistors of the fuse latch circuit is extended by an additional MOS transistor in a completely novel manner, thereby making it possible to report the set state of the fuse latch circuit.

Other features which are considered as characteristic for the invention are set forth in the appended claims.

Although the invention is illustrated and described herein as embodied in a fuse refresh circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
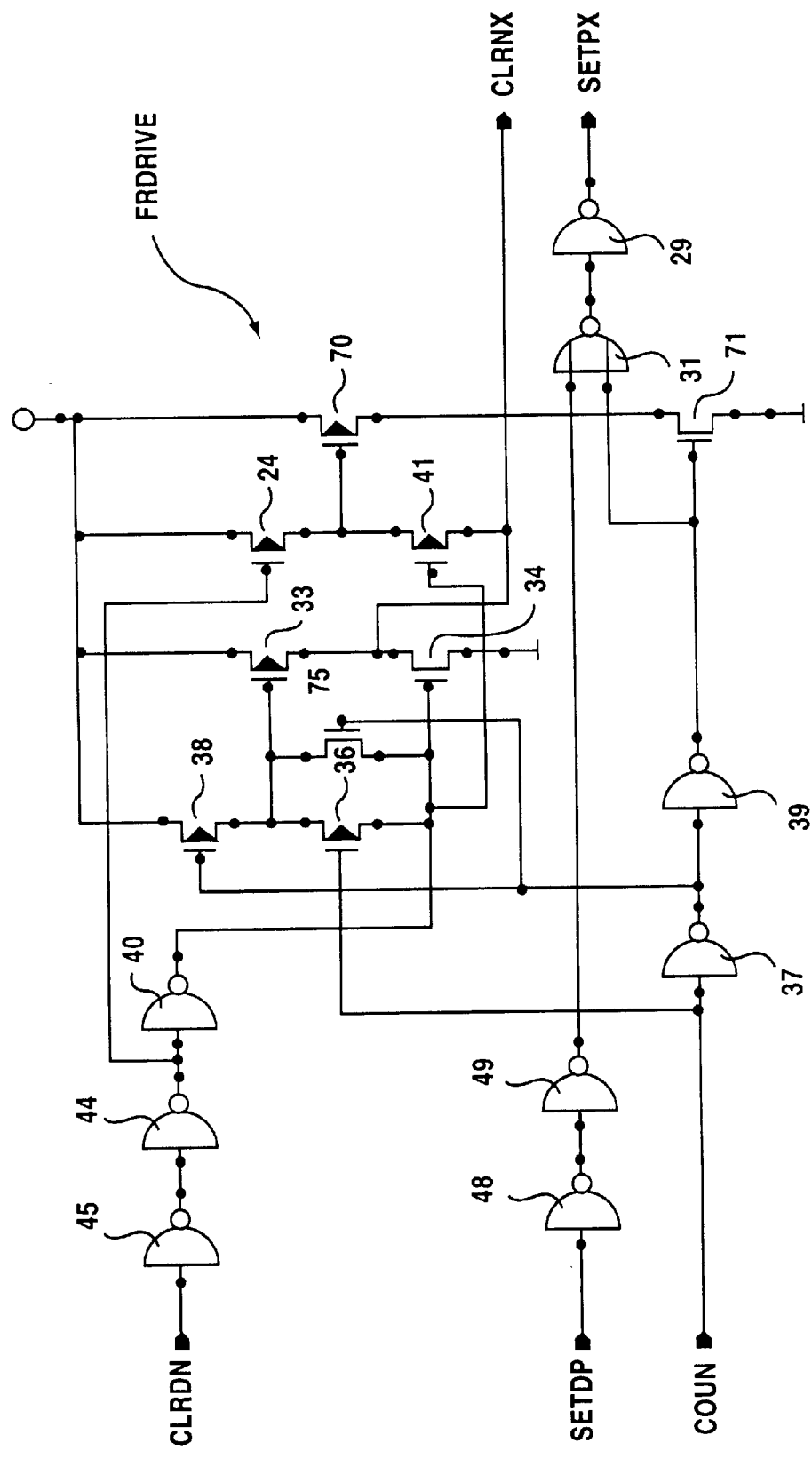
FIG. 1 is a circuit diagram of a fuse set circuit.
Figure 2:
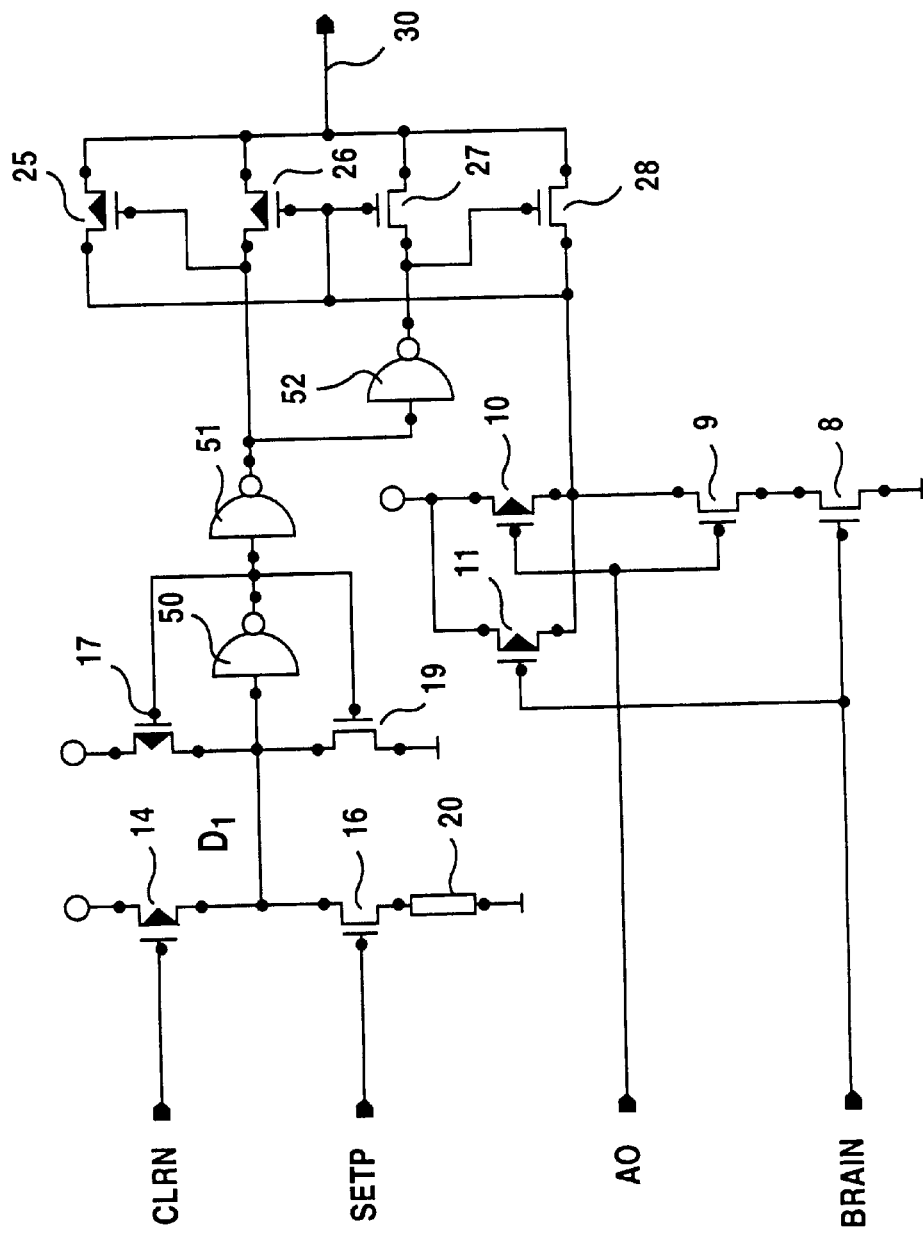
FIG. 2 is a circuit diagram of a prior art fuse refresh circuit.

Referring now to the figures of the drawing in detail in which reference numerals appear in accordance with FIG. 2, described above, and first, particularly, to FIG. 1 thereof, there is seen a fuse set circuit FRDRIVE. The circuit supplies special signals or pulses CLRNX and SETPX, which are then fed to the fuse refresh circuit according to the invention instead of the signals CLRN and SETP of the conventional fuse refresh circuit of FIG. 2.

Input signals CLRDN and SETDP of the fuse set circuit of FIG. 1 are the delayed signals CLRN and SETP of the set circuit and, in principle, are switched through actively by the fuse set circuit to the signals CLRNX and SETPX, whose profile will be explained in more detail below with reference to FIG. 5. The fuse latch circuit of the fuse refresh circuit according to the invention is then set by means of the signals CLRNX and SETPX in a manner similar to that which has been explained above, with reference to FIG. 2, for the prior art fuse refresh circuit.

It is essential that the signals CLRNX and SETPX have approximately the profile explained below with reference to FIG. 5. FIG. 1 merely constitutes an example of how these signals CLRNX and SETPX can be obtained from the signals COUN, CLRDN and SETDP. Those skilled in this art will appreciate that other circuit configurations are also possible for generating the signals CLRNX and SETPX with the desired profile from the signals CLRDN and SETDP.

In the fuse set circuit of FIG. 1 the signal CLRDN is first of all fed to a series circuit comprising three inverters 45, 44 and 40. The output of the inverter 40 is connected to the gate of a MOS transistor 34, which is connected in series with a MOS transistor 33. In addition, the node between the inverters 44 and 40 is connected to the gate of a MOS transistor 24, which is in turn connected in series with a MOS transistor 41. The output signal of the inverter 40 is applied to the gate of the MOS transistor 41 and to the gate of the MOS transistor 34 and is also fed via a MOS transistor 75 to the gate of the MOS transistor 33. The node between the MOS transistors 24 and 41 is connected to the gate of a MOS transistor 70. This MOS transistor 70 is in turn provided in series with a MOS transistor 71. A counting pulse COUN is applied to the gate of the MOS transistor 71 via inverters 37, 39. The pulse SETDP is fed via inverters 48, 49 to a NOR gate 31, the other input of which is connected to the gate of the MOS transistor 71 and to the output of the inverter 39. An inverter 29 is provided at the output of the NOR gate 31 and in turn supplies the pulse SETPX. The counting pulse COUN is additionally fed to the gate of a MOS transistor 36, which is connected in series with the MOS transistor 38. The output of the inverter 37 is connected to the gate of the MOS transistor 38. The source of the MOS transistor 38 is connected to the gate of the transistor 33. The drain of the MOS transistor 38 is connected to the drains of the transistors 33, 24 and 70, while the source and drain of the MOS transistor 36 are connected to the source and drain, respectively, of the MOS transistor 75 and to the gate of the MOS transistor 34.

The MOS transistors 36, 38, 33, 24, 41 and 70 are of a first conductivity type, while the MOS transistors 75, 34 and 71 are of a second, opposite conductivity type.

Figure 4:
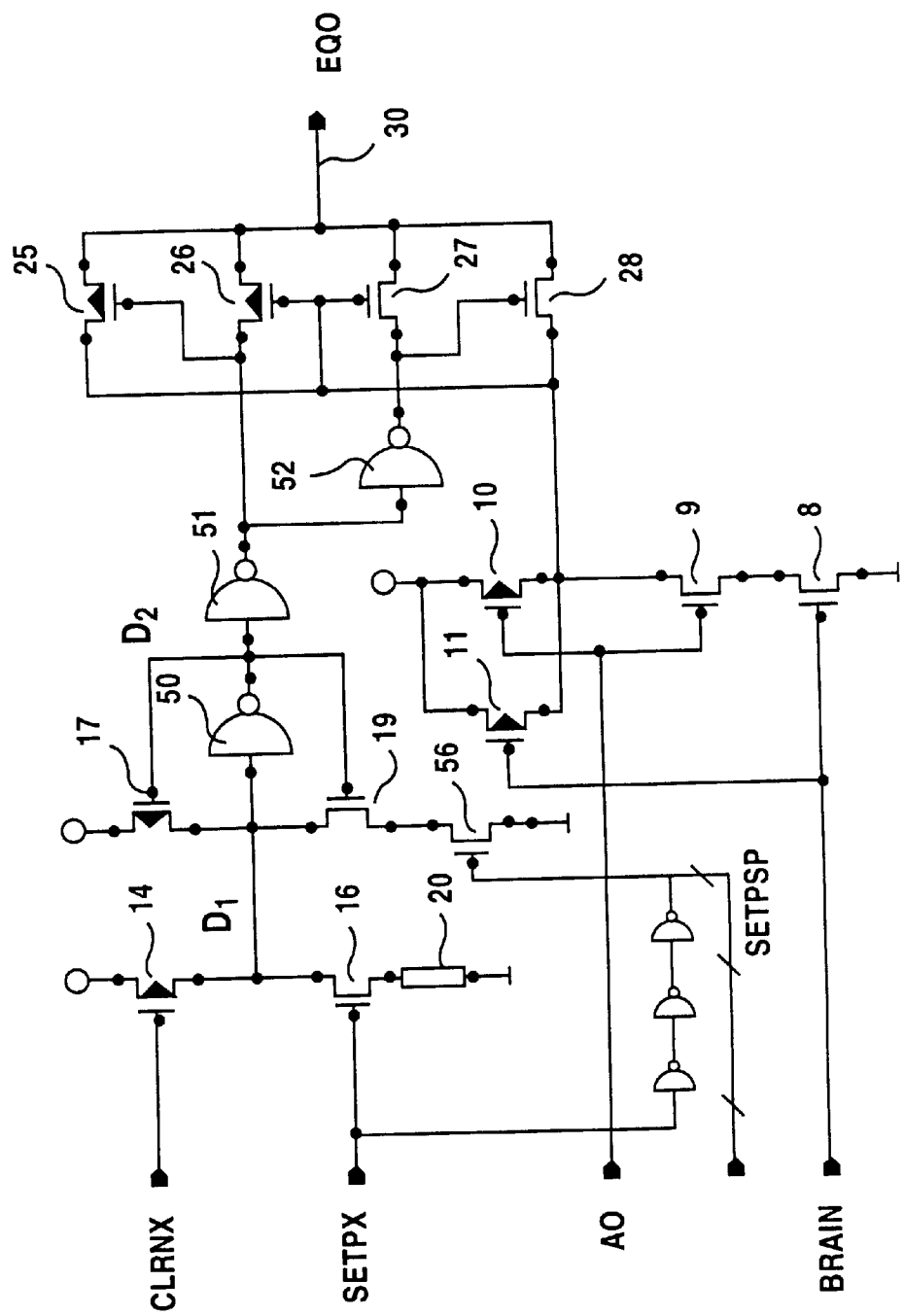
FIG. 4 is a circuit diagram of the fuse refresh circuit according to the invention.

The fuse refresh circuit according to the invention, the exemplary structure of which is shown diagrammatically in FIG. 4, is connected downstream of the FRDRIVE circuit of FIG. 1, which may be modified as noted above. It is thereby only essential that the signals CLRNX and SETPX are obtained with the specified profile (compare below FIG. 5).

The circuit of FIG. 4 differs from the circuit of FIG. 2 in that a MOS transistor 56, which has the same conductivity type as the MOS transistor 19, is additionally provided in series with said MOS transistor 19. A pulse SETPSP is applied to the gate of the MOS transistor 56.

During operation, the fuse latch circuit comprising the MOS transistors 17, 19, 56 and the inverter 50, in other words the signal D1, is initially set, after the semiconductor memory configuration has been switched on, in the same way as has been explained above with reference to FIG. 2. Two fuse refresh pulses are then generated for the signal COUN (compare FIG. 1) during the first eight RAS cycles, which are prescribed, for example, according to the specification, after the switching-on of the 16 Mbit DRAM before satisfactory functioning of the module is guaranteed, and in whose edges the row addresses are entered or "latched in". As is then evident from FIG. 5, the pulse COUN generates, by a delay, a SETPX pulse, which sets the fuse latch circuit, which had erroneously been set to "1", for example, to "0" (compare the pulse D1 (FUSEX)). At the same time, the signal CLRNX which is fed to the fuse refresh circuit of FIG. 4 is reduced by a defined voltage, which can be set by the transistor 71 (compare FIG. 1). As a result, the transistor 14 (compare FIG. 4) is switched on slightly, thereby forming a voltage divider comprising the transistors 14, 16 and the resistance of the fuse 20. If the resistance of the fuse 20 is actually greater than about 50 kΩ, that is to say if the fuse is severed, then the voltage divider comprising the MOS transistors 14, 16 and the fuse 20 is set in such a way that the fuse latch circuit, which had been erroneously set to "0", is set to "1" (compare the signal D1) (FUSEY). This is to be attributed to the fact that, for example given a fuse resistance of 100 kΩ and a resistance of the MOS transistor 14 of about 50 kΩ and a resistance of the MOS transistor 16 of 5 kΩ the signal D1 reaches about 2.5 V, which causes the inverter 50 to toggle, so that D2=0 is present at the output of the inverter 50, as a result of which the transistor 17 is turned on. The node between the transistors 14 and 16 thus receives the entire operating voltage of about 3.5 V, with the result that the signal D1 is set correctly to the value "1".

The signal SETPSP, which is fed to the gate of the MOS transistor 56, is generated by a 3-stage inverter cascade from the signal SETPX and switches the transistor 56 off. This switching-off is necessary since otherwise the above voltage divider principle would not operate in the desired manner. For a state of D1=0, a state D2=1 would apply, and with the transistor 19 in the on state, the fuse 20 would be short-circuited. If, however, the fuse 20 is not severed and the signal D1 is correctly set at "0" then the signal D1 remains set at 0, since the resistance of the fuse 20 in the above voltage divider is small, which also applies to the voltage drop.

By increasing the width of the transistor 71 (compare FIG. 1), it is possible for fuses whose resistance is less than 50 kΩ, for example 30 kΩ, still to be able to be identified as severed during fuse refresh operation. A greater reduction in the pulse CLRNX would, however, allow the current consumption to rise.

Figure 5:
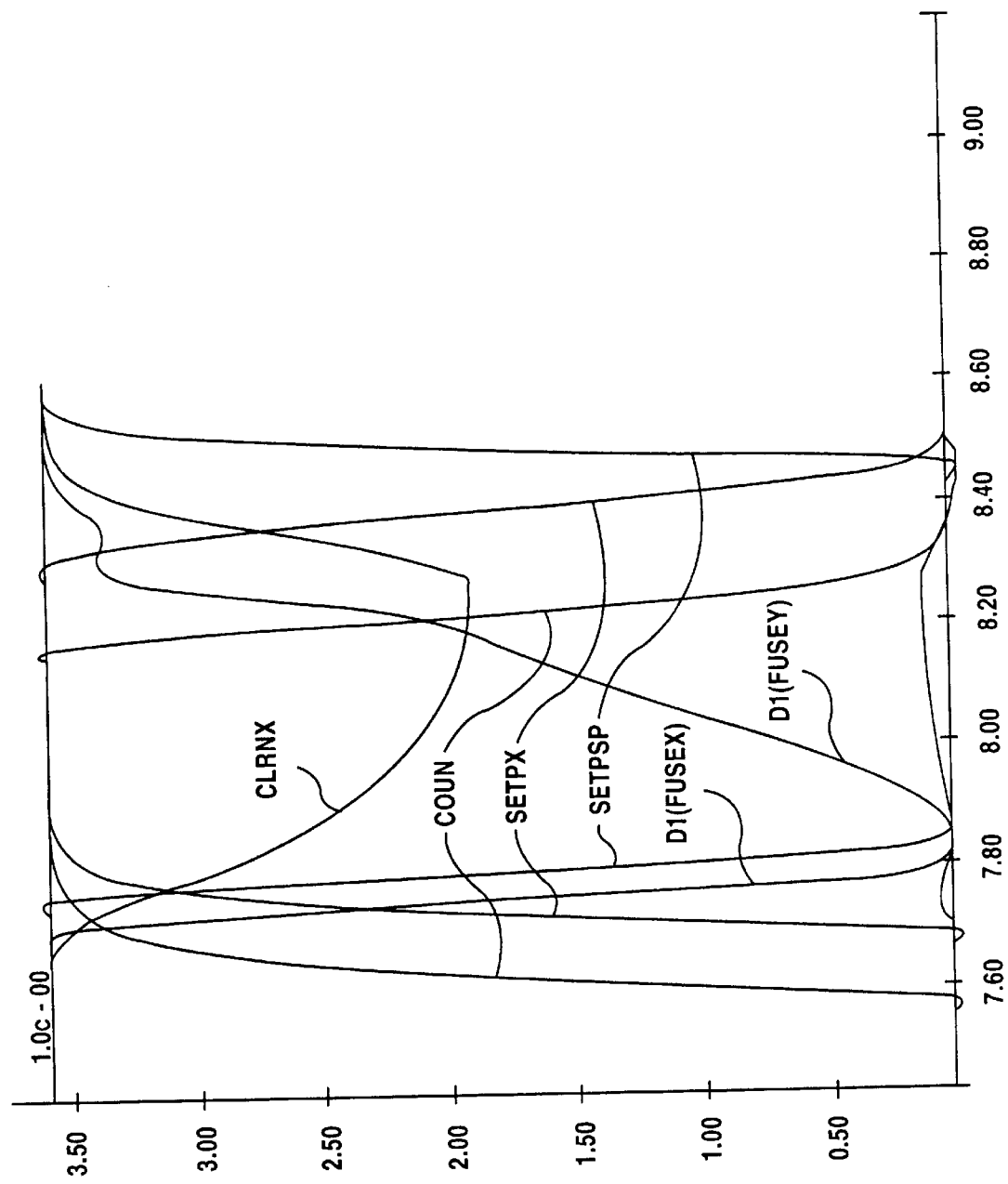
FIG. 5 is a graph showing the profile of individual fuse refresh signals.

FIG. 5 shows the relationship of the signals COUN, SETPX, SETPSP, CLRNX and D1 (FUSEX) as well as D1 (FUSEY). The time t (in ns) after the semi-conductor memory has been switched on is plotted on the abscissa and the voltage (in mV) is plotted on the ordinate.

Figure 6:
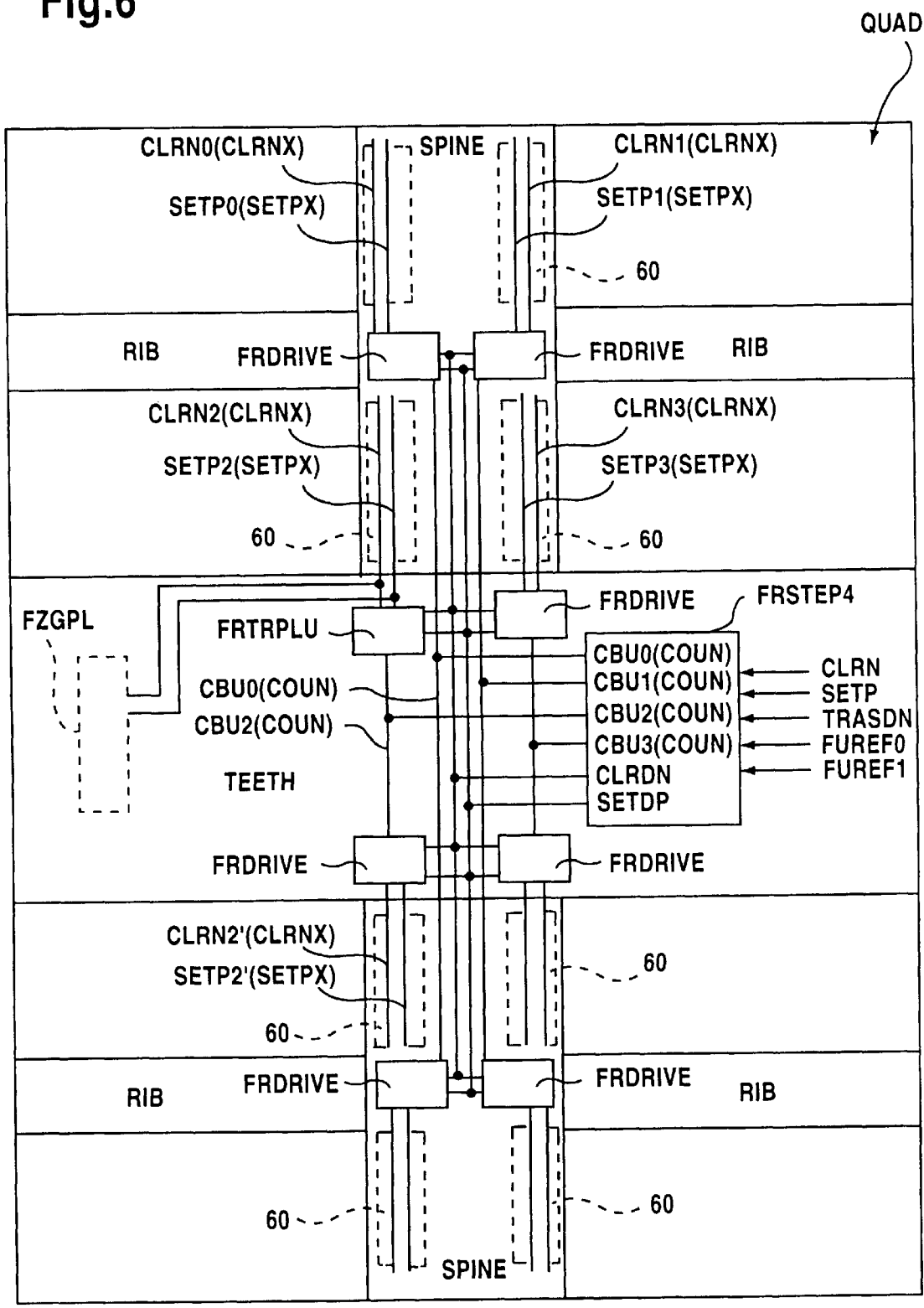
FIG. 6 is a schematic plan view of the fuse refresh circuits in a 16 Mbit DRAM.

FIG. 6 shows a plan view of a 16 Mbit DRAM, whereby various fuse set circuits FRDRIVE and fuse refresh circuits 60 are distributed on the semiconductor memory configuration.

The counting or fuse refresh trigger pulses COUN are generated by the circuit FRSTEP4 which is connected to the bus area of the semiconductor memory configuration. During the first eight RAS cycles after the semiconductor memory configuration has been switched on, this circuit FRSTEP4 supplies for each RAS cycle a respective fuse refresh pulse, i.e., one of the diagrammatically indicated four signals CBU0, CBU1, CBU2 and CBU3, which are obtained from the counting pulse COUN.

Specifically, in order for the fuse refresh operation to consume as little current as possible, in each case only one fourth of the fuses are refreshed in the 16 Mbit DRAM. The COUN signal for the first quarter of the module is called CBU0, for the second quarter CBU1, etc. During the first eight RAS cycles, therefore, the fuse refresh circuits 60 of one quadrant QUAD are refreshed per RAS cycle, namely, for example, half a quadrant QUAD above the area TEETH and half a quadrant below the area TEETH.

A fuse refresh pulse is also applied to a circuit FZGPL in the TEETH area during the signal CBU0.

All of the fuse latch circuits should be correctly set at the latest after the first eight RAS cycles after each switching-on of the semiconductor memory configuration. In order to then keep the current consumption due to the fuse refresh operation low, after the first eight RAS cycles the FRSTEP4 circuit only supplies a fuse refresh pulse for every thirty-two RAS cycles or a fuse refresh pulse for every sixteen or eight or four RAS cycles, which can be programmed via two fuse polysilicon bridges FZSTR4, FZSTR5 (the latter is not illustrated for purposes of simplicity of illustration).

The fuse refresh frequency can be found in Table 1 below:

TABLE 1

| Fuse refresh frequency | | |
| --- | --- | --- |
| FZSTR4 fuse | FZSTR5 fuse | Fuse refresh frequency |
| not severed | not severed | 1 Fuse refresh pulse for every 32 RAS cycles. A specific redundancy fuse is therefore refreshed once within 128 RAS cycles. Default setting |
| severed | not severed | 1 Fuse refresh pulse for every 16 RAS cycles |
| not severed | severed | 1 Fuse refresh pulse for every 8 RAS cycles |
| severed | severed | 1 Fuse refresh pulse for every 4 RAS cycles. A specific redundancy fuse is therefore refreshed once within 16 RAS cycles. |

In order to distinguish between the individual quadrants, the buses which are assigned to the signals and are laid primarily in areas SPINE and RIB are provided with a numerical addition in FIG. 6. Thus, for example, the bus, for the signal CLRN or CLRNX, which is routed to the fuse refresh circuit 60 at the top right is designated by "CLRN 1". The same is true similarly for the buses for the signal "SETP1".

The fuse refresh circuit according to the invention, in which correctly set fuse latch circuits are not reset and which is distinguished by a low current consumption, can be employed not only in DRAMs but also, for example, in read-only memories or ROMs.

Figure 3:
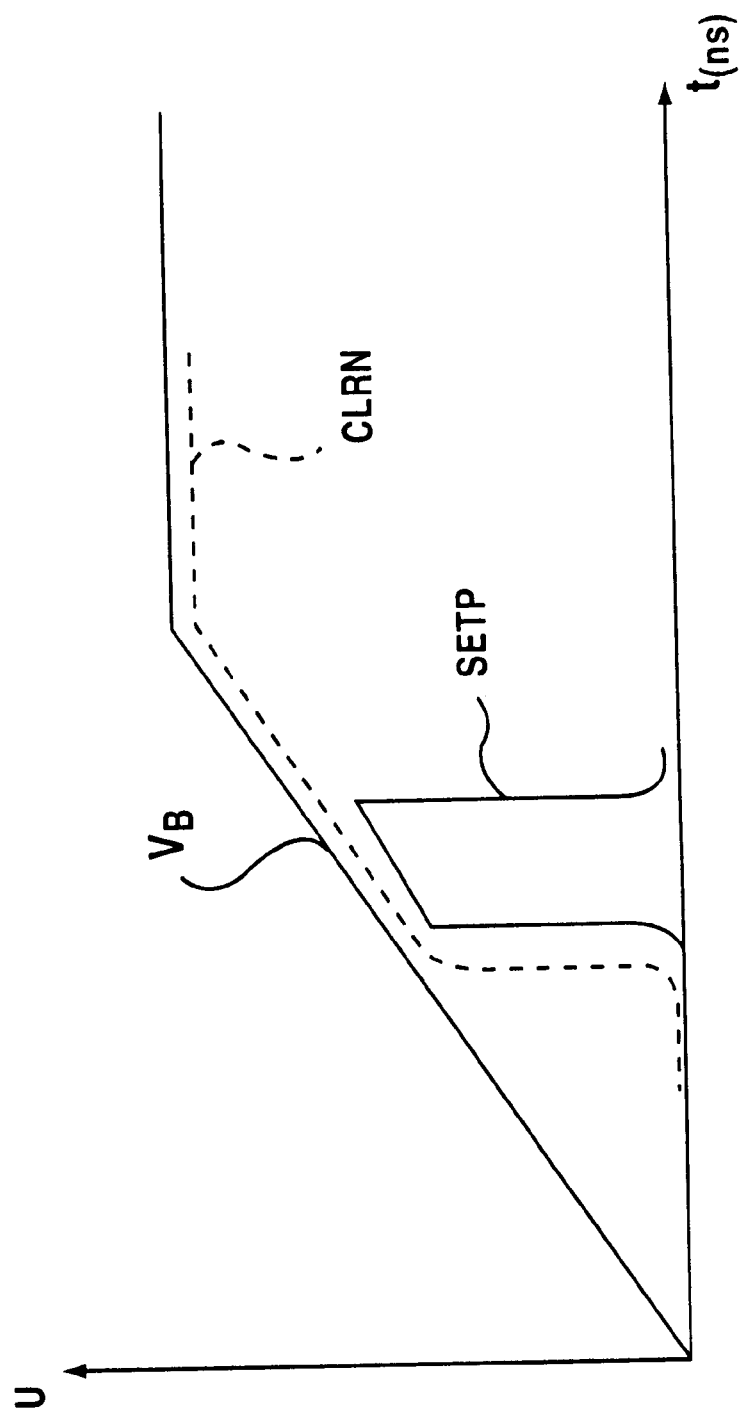
FIG. 3 is a graph showing a signal profile of the fuse refresh circuit.

In the fuse refresh circuit according to the invention, then, specially switched signals are fed to the fuse refresh circuit, which signals are generated from the signals COUN, CLRDN, SETDP in the circuit FRDRIVE. The signals CLRDN and SETDP are the delayed signals CLRN and SETP (compare FIG. 3), which are passed through without change by the circuit FRDRIVE and become the signals CLRNX and SETPX. After application of the operating voltage, the fuse latch circuits are set in a customary manner by these signals. Fuse refresh operation is subsequently carried out by the signal COUN, which generates the specially formed signals CLRNX and SETPX with the aid of the circuit FRDRIVE (compare FIG. 5).

We claim:

1. A fuse refresh circuit for a semiconductor memory, comprising:

a fuse latch circuit including a first MOS transistor, a second MOS transistor, a third MOS transistor, and an inverter, said first, second and third MOS transistors each having a gate and being mutually connected in series, said first MOS transistor being of a first conductivity type and said second and third MOS transistors being of a second conductivity type opposite to the first conductivity type, said inverter having an input connected to a node between said first and second MOS transistors and having an output connected to said gates of said first and second MOS transistors, and an end of said third MOS transistor remote from said second MOS transistor being connected to a reference potential;

a set circuit connected to said fuse latch circuit for setting said fuse latch circuit in at least one refresh cycle after a voltage supply has been switched on;

during the refresh cycle, said set circuit driving said fuse latch circuit with pulses such that a set state of the fuse latch circuit is evaluated and only an incorrectly set fuse latch circuit is reset; and said gate of said third MOS transistor being driven by a first one of the pulses driving said fuse latch circuit.

2. The fuse refresh circuit according to claim 1, wherein said reference potential is a ground potential.

3. The fuse refresh circuit according to claim 1, wherein said input of said inverter is connected to a series circuit comprising a fourth MOS transistor of the first conductivity type, a fifth MOS transistor of the second conductivity type and a fuse.

4. The fuse refresh circuit according to claim 3, wherein the pulses for driving said fuse latch circuit include the first pulse, a second pulse connected to a gate of said fourth MOS transistor, and a third pulse connected to a gate of said fifth MOS transistor.

5. The fuse refresh circuit according to claim 4, wherein the first pulse is generated by inverting and delaying the third pulse.

6. The fuse refresh circuit according to claim 3, wherein said input of said inverter is connected to a node formed between said fourth MOS transistor and said fifth MOS transistor.

7. The fuse refresh circuit according to claim 3, wherein a potential level of the second pulse is lower than a potential level of the third pulse.

8. The fuse refresh circuit according to claim 3, wherein said set circuit includes a series circuit comprising a plurality of inverters and a NOR gate, said series circuit generating the third pulse from a fuse refresh trigger pulse and a set pulse during an RAS cycle.

9. The fuse refresh circuit according to claim 8, wherein said set circuit includes a further plurality of inverters generating the second pulse from a fuse refresh trigger pulse and a clear pulse during the RAS cycle.

10. A fuse refresh circuit for a semiconductor memory, comprising:

a fuse latch circuit including, a voltage divider having a first and a second transistor connected in series, a first node between said first and said second transistor providing a first signal, and a fuse, said fuse latch circuit further including a latch circuit having a third, a fourth, and a fifth transistor connected in series, a second node provided between gates of said third and said fourth transistor and an inverter connected between said first and said second node and providing a second signal, said first transistor being controlled by a third signal, said second transistor being controlled by a fourth signal, said third and fourth transistor being controlled by the second signal, said fifth transistor being controlled by a fifth signal generated from the fourth signal being delayed and inverted; and a set circuit connected to said fuse latch circuit for providing the fourth signal and for setting said fuse latch circuit by means of the third signal in at least one refresh cycle after a voltage supply has been switched on, said set circuit including a sixth transistor delaying and reducing the third signal by a defined voltage for partly switching off said first transistor, the sixth signal switching off said fifth transistor, and the second signal switching on said third transistor.

11. The fuse refresh circuit according to claim 10, wherein said sixth transistor has a width, said width determining the defined voltage by which said third signal is reduced.

* * * * *